United States Patent
Duncan et al.

(10) Patent No.: US 12,306,613 B2
(45) Date of Patent: May 20, 2025

(54) SYSTEM AND METHOD FOR ENVIRONMENTAL CONDITION MANAGEMENT

(71) Applicant: Dell Products L.P., Round Rock, TX (US)

(72) Inventors: Tyler Baxter Duncan, Austin, TX (US); Michael Mitsuo Toulouse, San Jose, CA (US)

(73) Assignee: DELL PRODUCTS L.P., Round Rock, TX (US)

( * ) Notice: Subject to any disclaimer, the term of this patent is extended or adjusted under 35 U.S.C. 154(b) by 428 days.

(21) Appl. No.: 17/971,143

(22) Filed: Oct. 21, 2022

(65) Prior Publication Data
US 2024/0134349 A1 Apr. 25, 2024
US 2024/0231318 A9 Jul. 11, 2024

(51) Int. Cl.
*G05B 19/4155* (2006.01)

(52) U.S. Cl.
CPC ............... *G05B 19/4155* (2013.01); *G05B 2219/49216* (2013.01)

(58) Field of Classification Search
None
See application file for complete search history.

(56) References Cited

U.S. PATENT DOCUMENTS

2012/0234527 A1* 9/2012 Murayama ............ F24F 3/1405
                                                                165/287
2022/0326747 A1* 10/2022 Fitch .................. G05B 23/0286

* cited by examiner

*Primary Examiner* — Ryan A Jarrett
(74) *Attorney, Agent, or Firm* — Chamberlain, Hrdlicka, White, Williams & Aughtry; Aly Z. Dossa

(57) ABSTRACT

A method for managing environmental conditions of an information handling system includes obtaining an ambient temperature and an ambient humidity of an environment proximate to the information handling system. The method also includes determining a target relative humidity for the information handling system and determining a target temperature for the information handling system based on the target relative humidity, the ambient temperature, and the ambient humidity. Further, the method includes determining that the target temperature is within an acceptable range of temperatures. In addition, the method includes adjusting an amount of air recirculated through the information handling system, and adjusting the amount of air recirculated is based on the determination that the target temperature is within an acceptable range of temperatures.

20 Claims, 5 Drawing Sheets

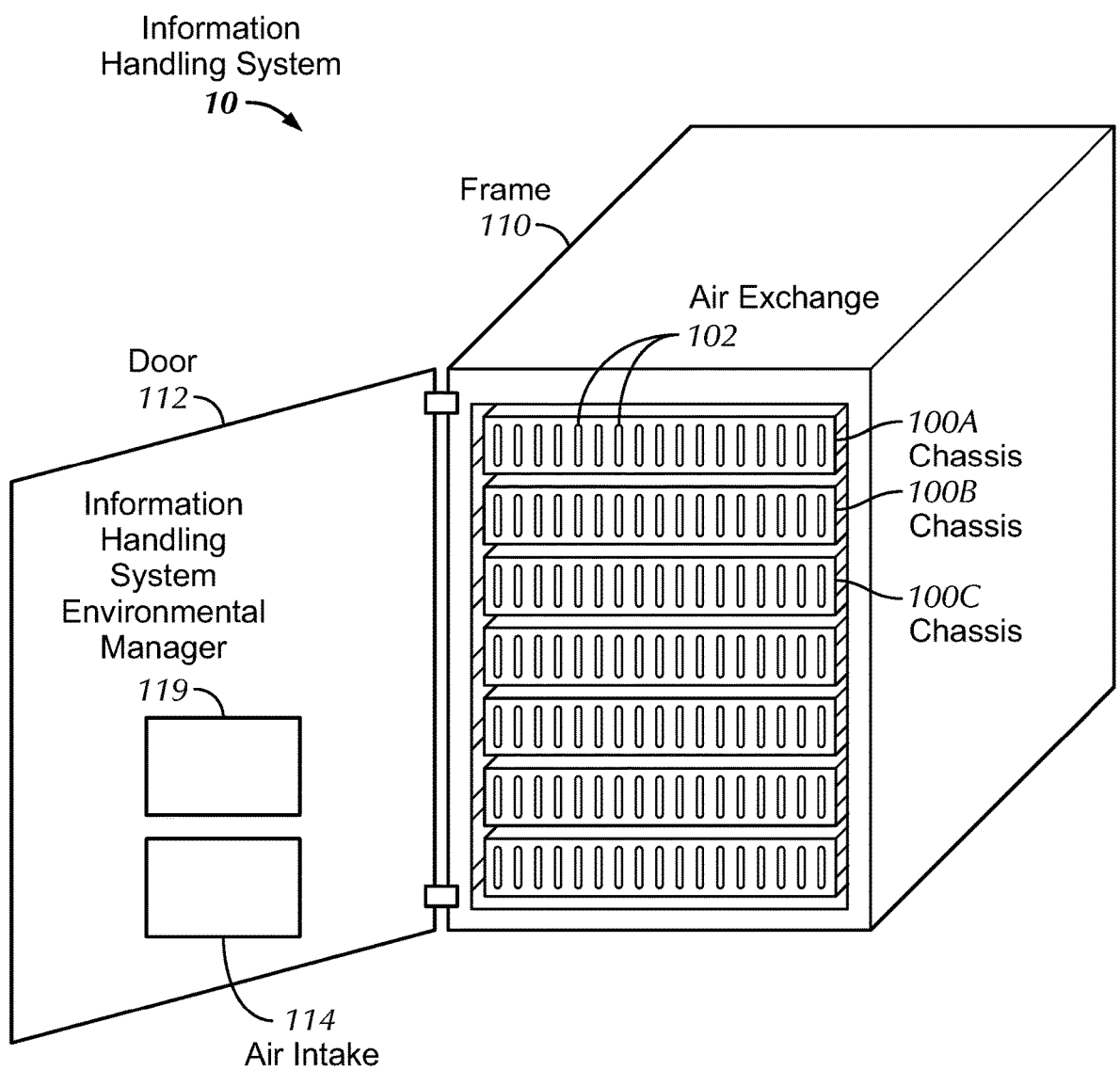
FIG. 1.1

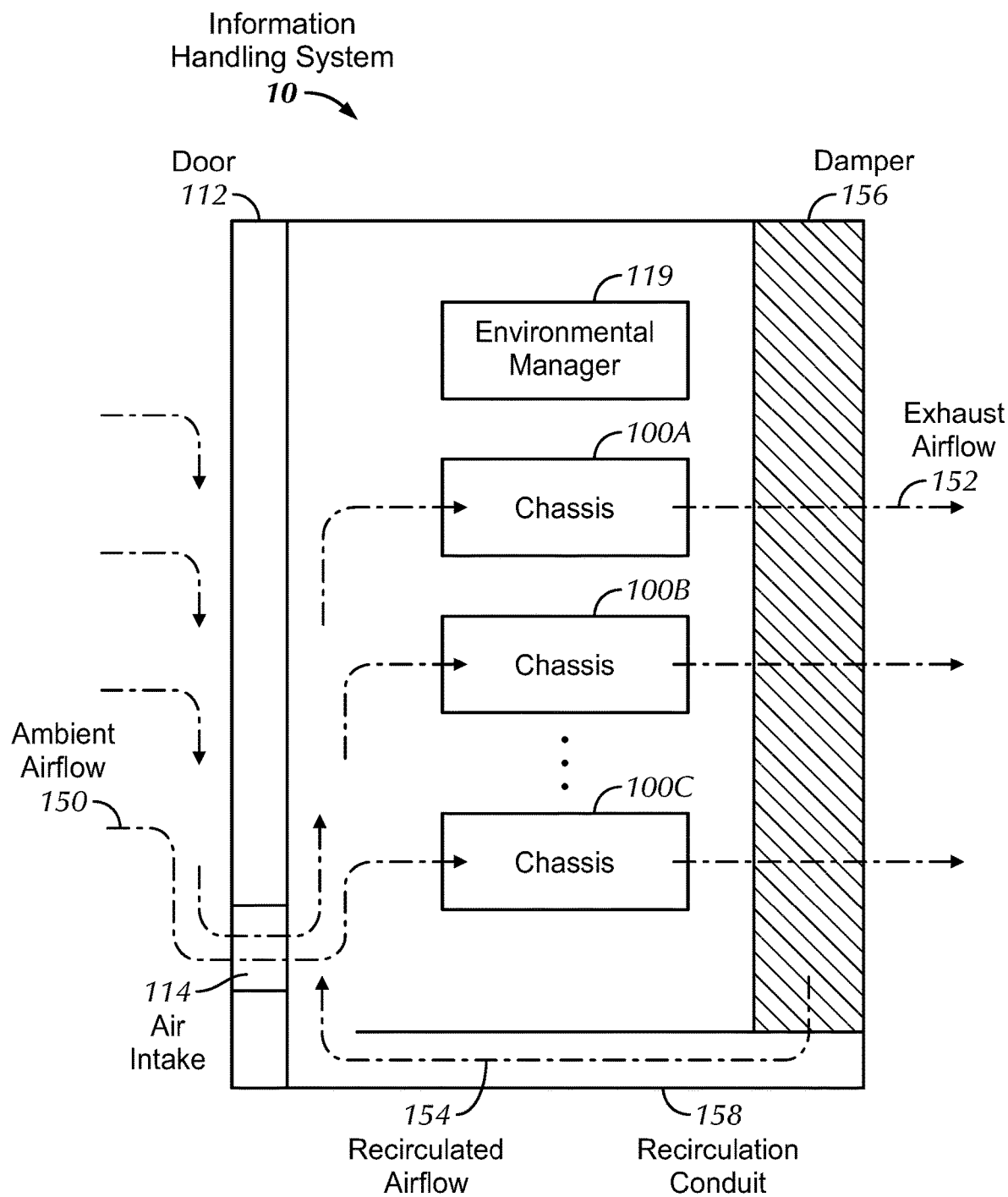
*FIG. 1.2*

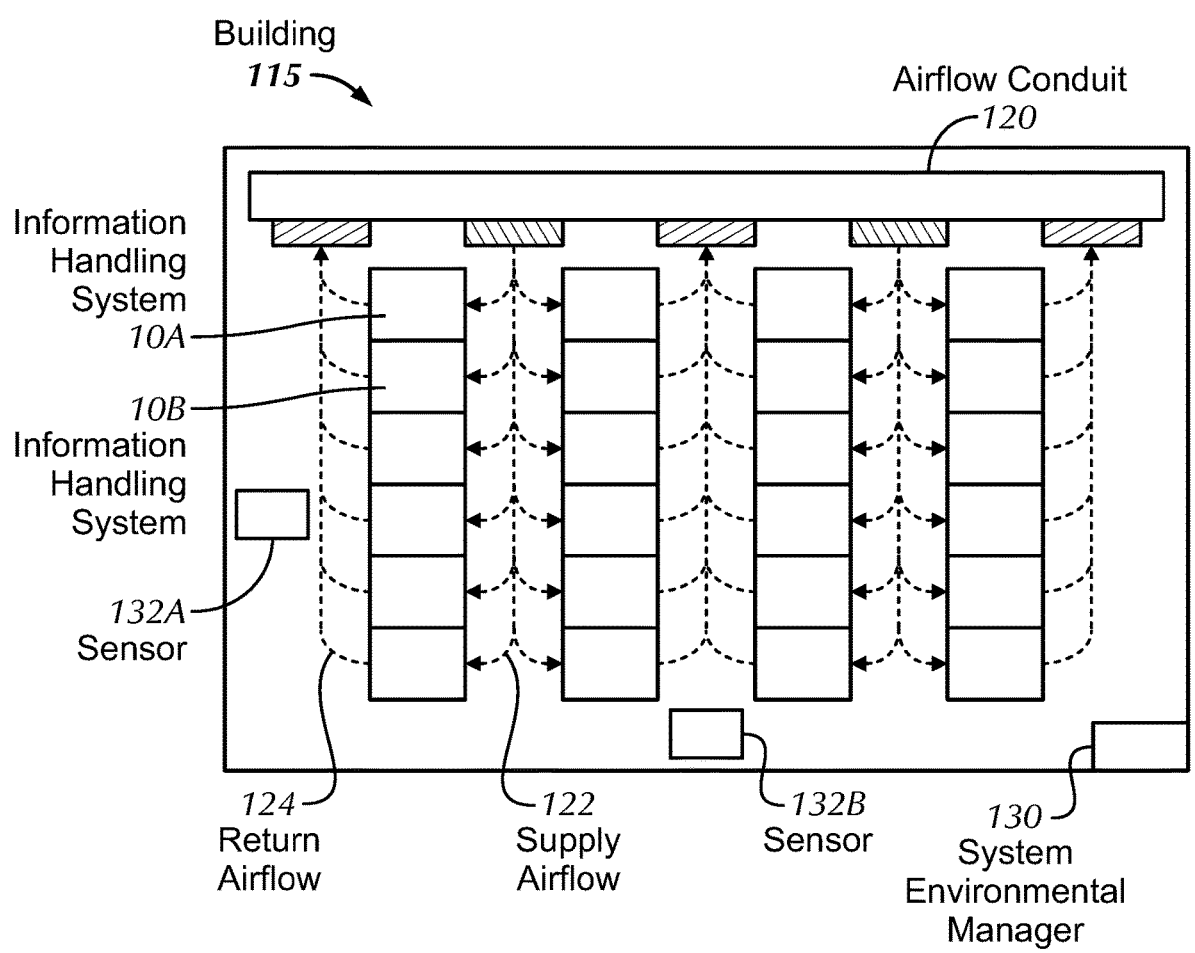
FIG. 1.3

SYSTEM AND METHOD FOR ENVIRONMENTAL CONDITION MANAGEMENT

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or a specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack two or more chassis in an information handling system. Due to the changing uses of information handling systems, chassis therein may be modular allowing for continual partial upgrades to the information handling system. That is, an information handling system may be composed of multiple chassis that may be attached to each other to form the information handling systems. When the multiple chassis are attached, components of the information handling system disposed in each of the chassis may become operably connected to each other.

SUMMARY

In one aspect, a method for environmentally managing environmental conditions of an information handling system in accordance with one or more embodiments of the invention includes obtaining an ambient temperature and an ambient humidity of an environment proximate to the information handling system. The method also includes determining a target relative humidity for the information handling system and determining a target temperature for the information handling system based on the target relative humidity, the ambient temperature, and the ambient humidity. Further, the method includes determining that the target temperature is within an acceptable range of temperatures. In addition, the method includes adjusting an amount of air recirculated through the information handling system, and adjusting the amount of air recirculated is based on the determination that the target temperature is within an acceptable range of temperatures.

In one aspect, an information handling system, in accordance with one or more embodiments of the invention, includes a first sensor configured to measure an ambient temperature of an environment proximate to the information handling system, a second sensor configured to measure an ambient humidity of the environment, and a processor. The processor is programmed to obtain the ambient temperature from the first sensor, obtain the ambient humidity from the second sensor, determine a target relative humidity for the information handling system, determine a target temperature for the information handling system based on the target relative humidity, the ambient temperature, and the ambient humidity, determine that the target temperature is within an acceptable range of temperatures, and adjust an amount of air recirculated through the information handling system, and adjusting the amount of air recirculated is based on the determination that the target temperature is within an acceptable range of temperatures.

In one aspect, a non-transitory computer readable medium includes computer readable program code, which when executed by a computer processor enables the computer processor to perform a method for managing environmental conditions of an information handling system. The method in accordance with one or more embodiments of the invention includes obtaining an ambient temperature and an ambient humidity of an environment proximate to the information handling system. The method also includes determining a target relative humidity for the information handling system and determining a target temperature for the information handling system based on the target relative humidity, the ambient temperature, and the ambient humidity. Further, the method includes determining that the target temperature is within an acceptable range of temperatures. In addition, the method includes adjusting an amount of air recirculated through the information handling system, and adjusting the amount of air recirculated is based on the determination that the target temperature is within an acceptable range of temperatures.

Other aspects of the invention will be apparent from the following description and the appended claims.

BRIEF DESCRIPTION OF DRAWINGS

FIG. 1.1 shows a diagram of an information handling system in accordance with one or more embodiments of the invention.

FIG. 1.2 shows a side view of an information handling system in accordance with one or more embodiments of the invention.

FIG. 1.3 shows a diagram of a building that includes information handling systems in accordance with one or more embodiments of the invention.

DETAILED DESCRIPTION

Figure 2:
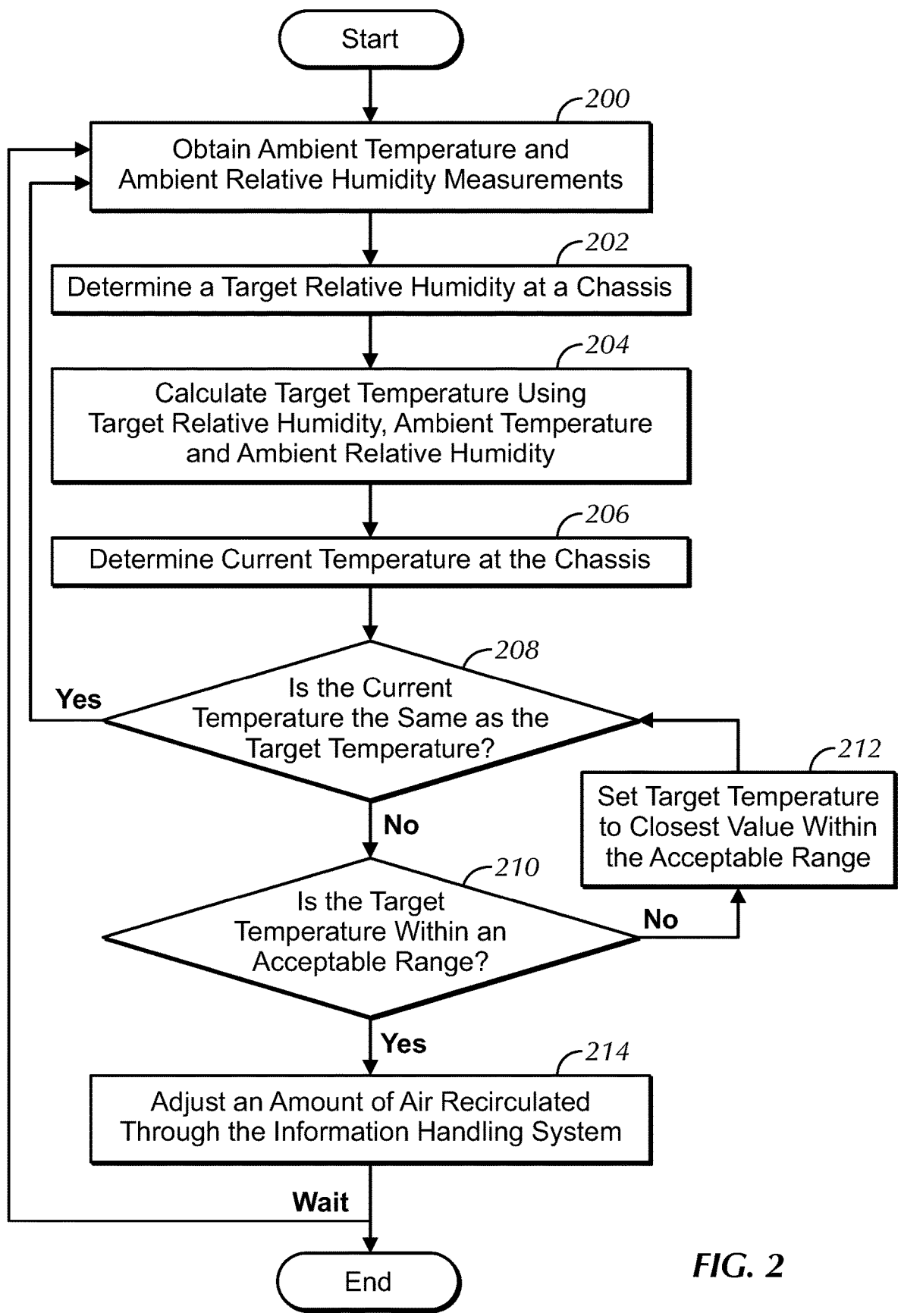
FIG. 2 shows a flowchart of a method of managing environmental conditions in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may generate heat and require gas flows to maintain the temperatures of these components within nominal ranges. However, these gases may include moisture that may cause components to degrade. The degradation may cause corrosion and/or damage to the components. The damage may cause the components to fail and/or cause information handling system utilizing the components to fail.

Embodiments of the invention may provide methods and systems that manage environmental conditions. To manage environmental conditions, the provided methods and systems may adjust an amount of air that is recirculated from an exhaust to an intake of the information handling system. By doing so, the methods and systems may control the temperature and relative humidity experienced by the computing devices in the information handling system.

By doing so, systems and methods in accordance with embodiments of the invention may be less likely to prematurely fail or otherwise enter an undesirable degradation state and/or may be less costly to operate by reducing the necessary level of conditioning of gases taken into chassis of information handling systems for thermal management purposes.

FIG. 1.1 shows an information handling system (10) and FIG. 1.2 shows a side view of airflows through the information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may be a rack mounted enclosure that enables chassis to be disposed within it. The frame (110) may be implemented as other types of structures adapted to house, position, orient, and/or otherwise physically, mechanically, electrically, and/or thermally manage chassis (e.g., direct airflows to the chassis). By managing the chassis, the frame (110) may enable multiple chassis to be densely packed in a space without negatively impacting the operation of the information handling system (10).

The frame may include a door (112). The door (112) may selectively provide access to the chassis (100A, 100B, 100C) within the information handling system (10). Further, the door may include an air intake (114). The air intake (114) may be adapted to allow an airflow from outside of the information handling system (10) to enter the information handling system (10) and cool the chassis (100A, 100B, 100C) within the information handling system (10). As such, the air intake (114) may include any kind of physical structure such as a grate, hole, etc. that allows air to pass through without departing from the invention. In addition, the air intake (114) may include one or more devices (e.g., a fan) to force air into the information handling system (10).

A chassis (e.g., 100A) may be a mechanical structure for housing components of an information handling system. For example, the chassis (100A, 100B, 100C) may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, a buildup of heat within a chassis may cause temperatures of the components disposed within the chassis to exceed preferred ranges. In addition, the temperature of the air affects the relative humidity in the air. Assuming no change to the absolute humidity, the relative humidity is correlated to the temperature (i.e., hotter air can hold more moisture).

The preferred ranges may include a nominal range in which the components respectively operate: (i) without detriment and/or (ii) are likely to be able to continue to operate through a predetermined service life of a component. Consequently, it may be desirable to maintain the temperature and/or relative humidity of the respective components.

To facilitate environmental control, the information handling system (10) includes components to provide airflows over the chassis to regulate temperature. For example, the information handling system (10) includes the air intake to enable an ambient airflow (150) to enter the interior of the information handling system (10). Further, the chassis may include air exchanges (e.g., 102). The air exchange (102) may be one or more openings in an exterior of a chassis that enables the chassis to exchange gases with the airflow (150). For example, a chassis may utilize air exchanges to (i) vent hot gases and (ii) intake cool gases. After the gases exchange heat with the chassis, the gases are exhausted from the chassis as an exhaust airflow (152), as shown in FIG. 1.2.

Some of the exhaust airflow (152) may be redirected back into the information handling system (10) as a recirculated airflow (154), which mixes with the ambient airflow (150), thereby adjusting the temperature and/or humidity of the gases exchanging heat with the chassis. A damper (156) may be used to redirect the exhaust airflow (152) into a recirculation conduit (158) to enable the recirculated airflow (154) to enter the information handling system (10) at a location that enables the recirculated airflow (154) to mix with the ambient airflow (150) before exchanging heat with the chassis. By doing so, the temperature and/or relative humidity of the gases within the chassis may be adjusted to within the nominal ranges.

In one or more embodiments, the damper (156) may be any device capable of redirecting all or a portion of the airflows without departing from the invention. For example, the damper (156) may be replaced by other mechanical deflectors such as a baffle. Further, for example, the damper (156) may be replaced by devices that form a pressure differential such as a fan or blower.

However, providing cooler gases may be problematic. As discussed above, relative humidity is correlated to temperature. Thus, cooling the gases raises the relative humidity, assuming no change in absolute humidity. The increase in relative humidity may (under certain conditions) condense, resulting in water (even at low levels) being disposed on the surfaces of the chassis (100A, 100B, 100C) and/or components. For example, when gases are taken into the chassis via an air exchange (102), water vapor may condense onto the surface of the air exchanger (102).

When water is disposed on the surface of the chassis (100A, 100B, 100C) and/or components (even at very small levels), the water may chemically react forming corrosion. Further, chemicals disposed on the surface may absorb the moisture in the air to form a solution that may cause corrosion (e.g., through deliquescence). The aforementioned reactions with the condensed water may damage the chassis (100A, 100B, 100C), generate corrosion products that may circulate throughout the chassis, and/or damage the components within the chassis (100A, 100B, 100C) or otherwise cause them to operate in an undesirable manner. As can be seen, an increase in relative humidity may cause increased corrosion, even though the temperature has decreased. To address the above and/or other potential issues, embodiments of the invention may provide methods, devices, and systems that recirculate exhaust gases back into the information handling system to adjust the temperature and relative humidity. By doing so, lower temperatures may be achieved while maintaining humidity levels within industry guidelines. In addition, lower power usage may be achieved.

In one or more embodiments of the invention, managing the recirculation of exhaust gases by an information handling system environmental manager (119) may be a computing device programmed to (i) obtain the current temperature and humidity of the ambient airflow (150), (ii) set a temperature setpoint based on the current temperature and humidity of the ambient airflow and a target relative humidity, and (iii) adjusting an amount of air recirculated based on the temperature setpoint.

To decide which action to perform, the information handling system environmental manager (119) may obtain and/or be provided information regarding the environmental conditions (e.g., temperatures and relative humidity) within each of the chassis. For example, the system information system environmental manager (119) may be operably connected to environmental managers of each of the chassis via any combination of wired and/or wireless networks.

In one or more embodiments of the invention, the information handling system environmental manager (119) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the information handling system environmental manager (119) described through this application and all, or a portion, of the method illustrated in FIG. 2. The information handling system environmental manager (119) may be implemented using other types of computing devices without departing from the invention. For additional details regarding computing devices, refer to FIG. 3.

In one or more embodiments of the invention, the information handling system environmental manager (119) may be implemented using a hardware device such as, but not limited to, circuitry. The information handling system environmental manager (119) may be implemented using, for example, a digital signal processor, a field programmable gate array, or an application specific integrated circuit. The information handling system environmental manager (119) may be implemented using other types of hardware devices without departing from the invention.

In one or more embodiments of the invention, the information handling system environmental manager (119) is implemented using computing code stored on a persistent storage that when executed by a processor performs all, or a portion, of the functionality of the information handling system environmental manager (119). The processor may be a hardware processor including circuitry such as, for example, a central processing unit or a microcontroller. The processor may be other types of hardware devices for processing digital information without departing from the invention.

In one or more embodiments of the invention, the information handling system environmental manager (119) is implemented using distributed computing devices. As used herein, a distributed computing device refers to functionality provided by a logical device that utilizes the computing resources of one or more separate and/or distinct computing devices. For example, in one or more embodiments of the invention, the information handling system environmental manager (119) is implemented using distributed devices that include components distributed across any number of separate and/or distinct computing devices. In such a scenario, the functionality of the information handling system environmental manager (119) may be performed by multiple and/or different computing devices without departing from the invention.

To further clarify the environments in which recirculating exhaust air may arise, a diagram of an environment in which chassis of IHSs may reside is illustrated in FIG. 1.3. However, it should be appreciated that IHSs may also reside individually.

Turning to FIG. 1.3, FIG. 1.3 shows a top view diagram of a building (115) in which chassis of IHSs may reside in accordance with one or more embodiments of the invention. The building (115) may house a data center (e.g., an aggregation of information handling systems) that includes any number of information handling systems (e.g., 10A, 10B). The information handling systems may include chassis, which may need to take in and exhaust gases for temperature regulation purposes due to heat generation by components disposed in the chassis.

To facilitate gas management within the building (115), the information handling systems may be organized into rows (or other groupings of information handling systems). In FIG. 1.3, the rows of information handling systems extend from top to bottom along the page. To enable gases to be provided to the information handling systems (e.g., for temperature regulation purposes), an airflow conduit (120) may be disposed within the building. The airflow conduit (120) may provide supply airflow (122) and take in a return airflow (124). These airflows are illustrated as arrows having dashed tails.

The supply airflow (122) may be at a lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conduit (120) and recirculated as the supply airflow (122).

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conduit (120). By doing so, the system environmental manager (130) may cause the airflow conduit (120) to provide gases to the information handling systems having a temperature and/or humidity level that may better enable the information handling systems to regulate their respective environmental conditions within the chassis of the respective information handling systems.

The airflow conduit (120) may include different functionality to modify the temperature and/or humidity level of the supply airflow (122). Consequently, different information handling systems (or groups thereof) may receive different supply airflows (e.g., 122), each having different characteristics (e.g., different temperatures and/or humidity levels, different sources, etc.). For example, the airflow conduit (120) may include components (e.g., dampers, baffles, fans, blowers, etc.) that may redirect return airflow (124) to the building (115) as supply airflow (122). Further, some of the return airflow (124) may be exhausted from the building (115). The system environmental manager (130) may control how much of the return airflow (124) is recirculated as supply airflow (122).

To decide how to set the operating points of the airflow conduit (120), the system environmental manager (130) may obtain and/or be provided information regarding the environmental conditions (e.g., temperatures, relative humidity levels) within each of the chassis. For example, the system environmental manager (130) may be operably connected to environmental managers of each of the chassis and/or the airflow conduit (120) via any combination of wired and/or wireless networks. The respective environmental managers of the chassis may provide such information to the system environmental manager (130) and/or service requests regarding the operating points of the airflow conduit (120) via the operable connections.

In addition to, or as an alternative to the above, the system environmental manager (130) may obtain and/or be provided information regarding the environmental conditions (e.g., temperatures, relative humidity levels) via any number of sensors (e.g., 132A, 132B) positioned at one or more locations in the building (115). For example, the system environmental manager (130) may be operably connected to sensors (132A, 132B) via any combination of wired and/or wireless networks. Further, the system environmental manager (130) may obtain and/or be provided information regarding the environmental conditions (e.g., temperatures, relative humidity levels) via sources outside the building (115) and/or control of the system environmental manager (130) that provides environmental conditions for an area at or near the building (115) (e.g., weather data).

In one or more embodiments of the invention, the system environmental manager (130) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the information handling system environmental manager (119) described through this application and all, or a portion, of the method illustrated in FIG. 2. The system environmental manager (130) may be implemented using other types of computing devices without departing from the invention. For additional details regarding computing devices, refer to FIG. 3.

In one or more embodiments of the invention, the system environmental manager (130) may be implemented using a hardware device including circuitry. The system environmental manager (130) may be implemented using, for example, a digital signal processor, a field programmable gate array, or an application specific integrated circuit. The system environmental manager (130) may be implemented using other types of hardware devices without departing from the invention.

In one or more embodiments of the invention, the system environmental manager (130) is implemented using computing code stored on a persistent storage that when executed by a processor performs all, or a portion, of the functionality of the system environmental manager (130). The processor may be a hardware processor including circuitry such as, for example, a central processing unit or a microcontroller. The processor may be other types of hardware devices for processing digital information without departing from the invention.

In one or more embodiments of the invention, the system environmental manager (130) is implemented using distributed computing devices. As used herein, a distributed computing device refers to functionality provided by a logical device that utilizes the computing resources of one or more separate and/or distinct computing devices. For example, in one or more embodiments of the invention, the system environmental manager (130) is implemented using distributed devices that include components distributed across any number of separate and/or distinct computing devices. In such a scenario, the functionality of the system environmental manager (130) may be performed by multiple, different computing devices without departing from the invention.

FIG. 2 shows a flowchart of a method in accordance with one or more embodiments of the invention. The method depicted in FIG. 2 may be used to manage a chassis environment in accordance with one or more embodiments of the invention. The method shown in FIG. 3 may be performed by, for example, an environmental manager (e.g., 119 (FIGS. 1.1-1.2) and/or 130 (FIG. 1.3)). Other components of the system illustrated in FIGS. 1.1-1.3 may perform all, or a portion, of the method of FIG. 2 without departing from the invention.

While FIG. 2 is illustrated as a series of steps, any of the steps may be omitted, performed in a different order, additional steps may be included, and/or any or all of the steps may be performed in a parallel and/or partially overlapping manner without departing from the invention.

In step 200, an ambient temperature and ambient relative humidity are obtained. The ambient temperature and/or the ambient relative humidity associated with the ambient environment may be monitored using, for example, one or more sensors positioned in the ambient environment (i.e., outside of a chassis). The monitoring may be performed for any duration of time.

As described above, each sensor may be positioned on an information handling system, in a position near the information handling system (e.g., in the same room or building), or somewhere else in the ambient environment (e.g., as part of a weather tracking service or other environmental condition monitoring system). In addition, each sensor may be positioned proximate to one another such that each sensor is providing measurements for one location. Further, the ambient temperature and ambient humidity values may be obtained and stored separately as two values, or they may be combined into a single value known as a dew point value.

In step 202, a target relative humidity at a chassis is determined. The target relative humidity may be based on industry guidelines, user settings, component specifications, or any other basis without departing from the invention. Further, the target relative humidity may be determined after determining that that a moisture level in a volume between the sensor(s) measuring ambient humidity data and the chassis is unchanged.

In step 204, a target temperature is calculated based on the target relative humidity, ambient temperature, and ambient relative humidity. For example, the calculation may be made using the Antoine equation. For example, with the ambient temperature and ambient relative humidity measurements, an assumption may be made that no additional moisture will enter the air between the sensor providing the measurement and the chassis. Thus, with the target relative humidity, the ambient temperature, and the ambient relative humidity, the target temperature may be calculated. Other methods for determining the target temperature may be used without departing from the invention.

In step 206, the current temperature at the chassis is determined. For example, the information handling system may include an integrated temperature sensor that may provide the current temperature.

In step 208, a determination is made about whether the current temperature is the same as the target temperature. If the current temperature is the same as the target temperature, the method proceeds to step 200; otherwise, the method proceeds to step 210.

In step 210, a determination is made about whether the target temperature is within an acceptable range. The acceptable range may be a range in which the components respectively operate: (i) without detriment and/or (ii) are likely to be able to continue to operate through a predetermined service life of a component. The acceptable range may include a lower bound and an upper bound. If the target temperature is not within the acceptable range, the method proceeds to step 212.

In step 212, the target temperature is set to the closest value within the acceptable range. In this manner, the target temperature is kept within the acceptable range. For example, consider a scenario in which the target temperature is 80° C. and the acceptable range is between 10-60° C. In this scenario, the target temperature is set to 60° C.

Continuing with the discussion, after setting the target temperature, the method proceeds to step 208.

In step 214, when it is determined that the target temperature is within the acceptable range, an amount of air recirculated through the information handling system is adjusted. As discussed above, air passing through the information handling system may be exhausted and some of the exhaust airflow may be redirected as a recirculated airflow. In this step, the environmental manager adjusts the amount of exhaust airflow that is redirected as the recirculated airflow. The adjustment may be made by adjusting a position of a damper or other mechanical deflector, such as a baffle. The adjustment may also be made by adjusting an operation of a fan or other device that forms a pressure differential, such as a blower. Further, the adjustment may increase the amount of air recirculated or decrease the amount of air recirculated, based on the change in temperature desired. Further, the magnitude of the adjustment may be correlated with a difference between the target temperature and the current temperature.

Following step 214, the method may end or the method may wait and proceed to step 200. By waiting and proceeding to step 200, the method may repeat, thereby enabling all of the steps to change and/or update based on changing conditions. For example, if the ambient temperature and/or humidity changes, then the target temperature may also change. By returning to step 200, the method may account for the change and update the amount of air recirculated. Further, these updates may be made in sufficiently short time increments as to be considered real-time updates.

Figure 3:
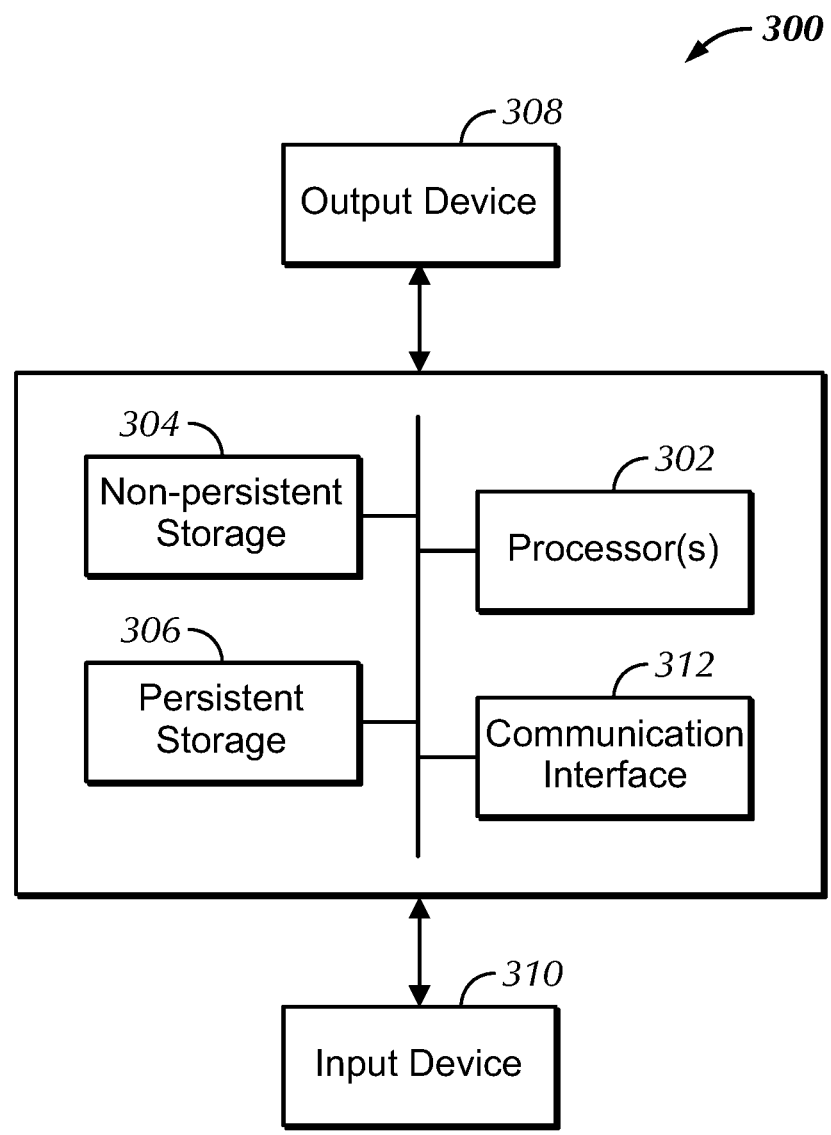
FIG. 3 shows a diagram of a computing device in accordance with one or more embodiments of the invention.

Embodiments of the invention may be implemented using a computing device. FIG. 3 shows a diagram of a computing device in accordance with one or more embodiments of the invention. The computing device (300) may include one or more computer processors (302), non-persistent storage (304) (e.g., volatile memory, such as random access memory (RAM), cache memory), persistent storage (306) (e.g., a hard disk, an optical drive such as a compact disk (CD) drive or digital versatile disk (DVD) drive, a flash memory, etc.), a communication interface (312) (e.g., Bluetooth interface, infrared interface, network interface, optical interface, etc.), input devices (310), output devices (308), and numerous other elements (not shown) and functionalities. Each of these components is described below.

In one embodiment of the invention, the computer processor(s) (302) may be an integrated circuit for processing instructions. For example, the computer processor(s) may be one or more cores or micro-cores of a processor. The computing device (300) may also include one or more input devices (310), such as a touchscreen, keyboard, mouse, microphone, touchpad, electronic pen, or any other type of input device. Further, the communication interface (312) may include an integrated circuit for connecting the computing device (300) to a network (not shown) (e.g., a local area network (LAN), a wide area network (WAN) such as the Internet, mobile network, or any other type of network) and/or to another device, such as another computing device.

In one embodiment of the invention, the computing device (300) may include one or more output devices (308), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (302), non-persistent storage (304), and persistent storage (306). Many different types of computing devices exist, and the aforementioned input and output device(s) may take other forms.

Embodiments of the invention may provide an improved method for managing the environment of an information handling system. Specifically, embodiments of the invention may provide a method and device for managing environmental conditions. To do so, embodiments of the invention may provide systems and methods that adjust an amount of air recirculated into the information handling system based on a target relative humidity and target temperature. By doing so, temperatures and/or relative humidities experienced by information handling systems may be managed, thereby increasing the service lives of components and the reliability of information handling systems. Further, by controlling for the relative humidity as well as the temperature, the methods and systems may provide airflows at lower temperatures, thereby improving the thermal efficiency of the heat exchanged between the airflow and the information handling system. In addition, the methods and systems may reduce the power consumed by the information handling system, thereby reducing operating costs.

Thus, embodiments of the invention may address the problem of providing reliability and reducing operating costs for information handling systems. Specifically, embodiments of the invention may provide a method of managing environmental conditions in an information handling system.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the computing device (300). Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for managing environmental conditions of an information handling system, comprising:
    obtaining an ambient temperature and an ambient humidity of an environment proximate to the information handling system;
    determining a target relative humidity for the information handling system;
    determining a target temperature for the information handling system based on the target relative humidity, the ambient temperature, and the ambient humidity;
    determining that the target temperature is within an acceptable range of temperatures; and
    adjusting an amount of air recirculated through the information handling system, wherein adjusting the amount of air recirculated is based on the target temperature and is in response to the determination that the target temperature is within an acceptable range of temperatures.

2. The method of claim 1, wherein adjusting the amount of air recirculated comprises adjusting a position of a damper.

3. The method of claim 1, wherein adjusting the amount of air recirculated comprises adjusting an operation of a fan.

4. The method of claim 1, wherein obtaining the ambient temperature and ambient humidity comprises receiving data from a sensor of the information handling system.

5. The method of claim 1, further comprising:
    updating the target temperature based on a change in the ambient temperature or the ambient humidity after adjusting the amount of air recirculated; and
    further adjusting the amount of air recirculated.

6. The method of claim 5, wherein the updating is performed in real-time.

7. The method of claim 1, wherein adjusting the amount of air recirculated comprises increasing the amount of air recirculated.

8. An information handling system comprising:
    a first sensor configured to measure an ambient temperature of an environment proximate to the information handling system;
    a second sensor configured to measure an ambient humidity of the environment; and
    a processor programmed to:
        obtain the ambient temperature from the first sensor;
        obtain the ambient humidity from the second sensor;
        determine a target relative humidity for the information handling system based on a determination that a moisture level in a volume between the second sensor and the a chassis of the information handling system is unchanged;
        determine a target temperature for the information handling system based on the target relative humidity, the ambient temperature, and the ambient humidity;
        determine that the target temperature is within an acceptable range of temperatures; and
        adjust an amount of air recirculated through the information handling system, wherein adjusting the amount of air recirculated is based on the target temperature and is in response to the determination that the target temperature is within an acceptable range of temperatures.

9. The information handling system of claim 8, further comprising:
    a damper configured to adjust the amount of air recirculated through the information handling system based on a position of the damper, and
    wherein adjusting the amount of air recirculated comprises adjusting the position of a damper.

10. The information handling system of claim 8, further comprising:
    a fan configured to adjust the amount of air recirculated through the information handling system, and wherein adjusting an amount of air recirculated comprises modifying an operation of the fan.

11. The information handling system of claim 8, wherein adjusting the amount of air recirculated comprises decreasing the amount of air recirculated.

12. The information handling system of claim 11, wherein the first sensor and the second sensor are a single sensor.

13. The information handling system of claim 8, wherein the processor is further programmed to:
update, in real-time, the target temperature based on a change in the ambient temperature or the ambient humidity.

14. A non-transitory computer readable medium comprising computer readable program code, which when executed by a computer processor enables the computer processor to perform a method for managing environmental conditions of an information handling system, the method comprising:
obtaining an ambient temperature and an ambient humidity of an environment proximate to the information handling system;
determining a target relative humidity for the information handling system;
determining a target temperature for the information handling system based on the target relative humidity, the ambient temperature, and the ambient humidity;
determining that the target temperature is within an acceptable range of temperatures; and
adjusting an amount of air recirculated through the information handling system, wherein adjusting the amount of air recirculated is based on the target temperature and is in response to the determination that the target temperature is within an acceptable range of temperatures.

15. The non-transitory computer readable medium of claim 14, wherein adjusting the amount of air recirculated comprises adjusting a position of a damper.

16. The non-transitory computer readable medium of claim 14, wherein adjusting the amount of air recirculated comprises adjusting an operation of a fan.

17. The non-transitory computer readable medium of claim 14, wherein obtaining the ambient temperature and ambient humidity comprises receiving data from a sensor of the information handling system.

18. The non-transitory computer readable medium of claim 14, wherein the method further comprises:
updating the target temperature based on a change in the ambient temperature or the ambient humidity after adjusting the amount of air recirculated; and
further adjusting the amount of air recirculated.

19. The non-transitory computer readable medium of claim 18, wherein the updating is performed in real-time.

20. The non-transitory computer readable medium of claim 14, wherein adjusting the amount of air recirculated comprises increasing the amount of air recirculated.

* * * * *